United States Patent [19]

Haus, Jr.

[11] Patent Number: 5,017,877
[45] Date of Patent: May 21, 1991

[54] WATTHOUR METER OPEN POTENTIAL CIRCUIT DETECTING DEVICE

[76] Inventor: Paul Z. Haus, Jr., 787 Hartwell St., Teaneck, N.J. 07666

[21] Appl. No.: 429,981

[22] Filed: Nov. 1, 1989

[51] Int. Cl.⁵ ............................................. G01R 31/06
[52] U.S. Cl. ................................. 324/546; 324/110; 324/529; 340/637
[58] Field of Search ....... 324/529, 546, 110, 158 MG, 324/127; 340/637, 648, 567

[56] References Cited

U.S. PATENT DOCUMENTS

| | | | |
|---|---|---|---|
| 1,569,299 | 1/1926 | Preston | 340/637 |
| 1,960,848 | 5/1934 | Jones | 340/637 |
| 2,103,179 | 12/1937 | Rennau | 324/546 |
| 3,487,306 | 12/1969 | Harmer | 324/67 |

FOREIGN PATENT DOCUMENTS 1114988  6/1984  U.S.S.R. .............................. 324/546

Primary Examiner—Kenneth Wieder
Assistant Examiner—Jose M. Solis
Attorney, Agent, or Firm—Brooks Haidt Haffner & Delahunty

[57] ABSTRACT

There is described a magnetic field detecting device having a pickup coil surrounding a tee shape core of magnetic material which is packaged in a housing having external indicia to indicate location and orientation of the magnetic core. A battery operated voltage sensitive relay circuit activates an audible annunciator when the pickup coil is placed adjacent a current-carrying potential coil in a polyphase watthour meter. Scanning the watthour meter with the device placed against the meter glass housing serves to reveal an open circuited potential coil.

18 Claims, 4 Drawing Sheets

WATTHOUR METER OPEN POTENTIAL CIRCUIT DETECTING DEVICE

BACKGROUND OF THE INVENTION

The present invention relates to electric power meters and particularly to a device for detecting open potential circuits in watthour meters and the like.

Particularly with polyphase watthour or demand meters having more than one potential coil the meter will continue to register power consumption, albeit deficiently, if less than all the potential coils are open circuited. This has enabled theft of power by unscrupulous customers, it not being unknown for a customer to surreptitiously disconnect a potential coil in such manner that it is not detectable by mere visual examination. Even if a potential coil in a polyphase meter should become inoperative due merely to instrument failure, such meter will still appear to visual observation to be operating properly when electrical energy is being used.

Many attempts have been made to provide convenient indication to the meter reader employed by the power company to reveal the meter defect or tampering. U.S. Pat. No. 863,109, issued Aug. 13, 1907 to Simpson et al., describes a relay circuit to be connected in series with the meter for the stated purpose "to prevent tapping of the circuits by maliciously-disposed persons, to detect defective installation or wiring, or other diversion from such measuring instruments of the currents designed to pass through them." Other patents disclose meters provided with auxiliary magnetically actuated mechanical flags for indicating an open circuit. In fact, a large body of prior art exists where some form of detection mechanism or means is incorporated within the meter. However, in the same manner that access is obtained to the meter interior for disconnecting a potential coil, the detection mechanism can be thwarted.

An alternative approach using a device carried by the meter reader is the basis of Phillips U.S. Pat. No. 4,583,043, issued Apr. 15, 1986, entitled "Determination of Electrical Energy Diversion". This device employs two clip-on transformers, one for connection about an inlet power cable from the electric utility and the other about an inlet power supply to the consumer. Electric current measuring means determines any difference in the current sensed by the two transformers. Unfortunately, the Phillips device requires the individual power conductors to be accessible and this generally is not the case, the conductors normally being enclosed within a cable containing the return conductor. A transformer around such cable will detect zero current.

A company named KC Industries, Inc., whose address is Box E, Cambridge, Nebr. 69022, has produced a magnetic flux indicator which, according to the advertising copy of the manufacturer, was designed to enable polyphase meters to be easily checked without removing the meter or making any connections to the meter. The flux indicator employs a mechanical analog movement in a small case. The operating instructions in the advertisement reads: "Simply hold the 'Magnetic Flux Indicator' level and parallel to the outer surface of the meter case, with either side against the glass meter cover (the unit does not have to be removed from its protective carrying case to be used, if it is ordered with this option). Rotate the MFI around the meter until a potential coil is located. A deflection of the indicator means the coil is energized, the absence of a deflection denotes an open or faulty coil. Both potential coils should be checked in this manner to ensure that they are properly energized. As the potential coils may vary in mounting location in various meters, the amount of deflection will vary from meter to meter. Thus, it is not the magnitude of the deflection which is important, but simply whether or not there is a deflection."

While the "Magnetic Flux Indicator" described above can detect open coils, it has certain limitations inherent in its use of a mechanical analog indicator. A serious drawback is encountered when the energy or demand meter is located above shoulder level because the device is orientation sensitive, and the meter movement becomes difficult if not impossible to read when the energy meter is located high up. Also, the meters are not always found in a well illuminated location, and holding a flashlight makes it even more difficult to use when the meters are mounted at a higher elevation from the floor. Another problem arises from the analog indication. Unless the meter reader is trained especially in the use of the KC Industries, Inc. device, there is considerable room for error. An absence of a deflection of the indicator could be due to an improper positioning or orientation of the device and not due to an inoperative voltage coil.

SUMMARY OF THE INVENTION

Therefore, it is an object of the present invention to provide a light-weight small portable device that can be carried by meter reading personnel or other field workers to detect inoperative potential (voltage) coils in watthour meters, particularly in polyphase meters with multiple voltage coils.

Another object is to provide a portable hand holdable open-coil detector for detecting the absence of a magnetic field proximate to a voltage coil of an electric power meter.

A further object of the invention is to provide a method for detecting deenergized voltage coils in meters with multiple voltage coils without entering the meter housing.

In accordance with one aspect of the present invention there is provided a portable hand holdable open-coil detector for detecting the absence of a detectable magnetic field proximate to a voltage coil of an electric power meter, comprising in combination a multi-turn coil mounted on a magnetic core, voltage detecting means coupled to said multi-turn coil and including bi-conditional signalling means, and housing means for said multi-turn coil, magnetic core, and voltage detecting means, said housing means having walls and locating said magnetic core in a predetermined disposition relative to said walls such that when said housing is placed in a predetermined orientation in contact with the enclosure encompassing a normally operating electric power meter in a position overlying a meter voltage coil carrying current, sufficient voltage will be induced in said multi-turn coil to alter the condition of said signalling means from a first condition indicative of a nonactive voltage coil to a second condition indicative of an active voltage coil.

BRIEF DESCRIPTION OF THE DRAWINGS

The invention will be better understood after reading the following detailed description of the presently preferred embodiment thereof with reference to the appended drawings in which.

The same reference numerals are used throughout the drawings to designate the same or similar parts.

DETAILED DESCRIPTION OF THE PRESENTLY PREFERRED EMBODIMENT

Figure 1:
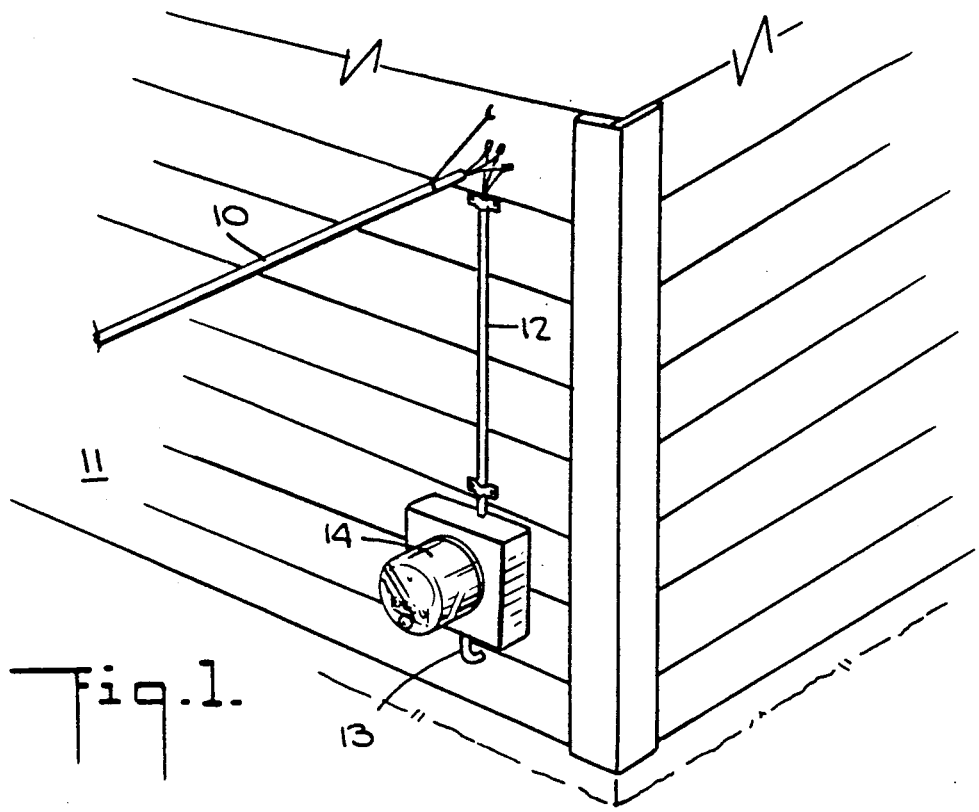
FIG. 1 is a fragmentary perspective view of a corner of a building showing a typical meter installation for recording electric power consumption.

Referring to the drawings, there is shown in FIG. 1 a typical electric service entry consisting of multi-phase lines 10 connected from a pole (not shown) to the building 11, spliced to a down cable 12 which enters the building at 13 after passing through a watthour or watthour demand meter 14. This illustration is intended to be only exemplary since various service entries are used in the field and the invention concerns itself only with detecting a defect or alteration in the meter 14.

As is well known, the typical watthour meter, with or without a demand indicator, made for polyphase service, has multiple voltage coils and corresponding current coils all wound on pole structures for cooperating in driving fashion with an eddy current disc. In the interest of efficiency and to minimize meter sensitivity to externally applied magnetic fields, manufacturers of the meters make all reasonable effort to shield or minimize development of stray fields. Moreover, the physical location of the voltage coils within the meters vary from one manufacturer to the next. Nevertheless, the subject invention has been tested successfully with all of the meters known to be in operation within the metropolitan New York region.

Figure 8:
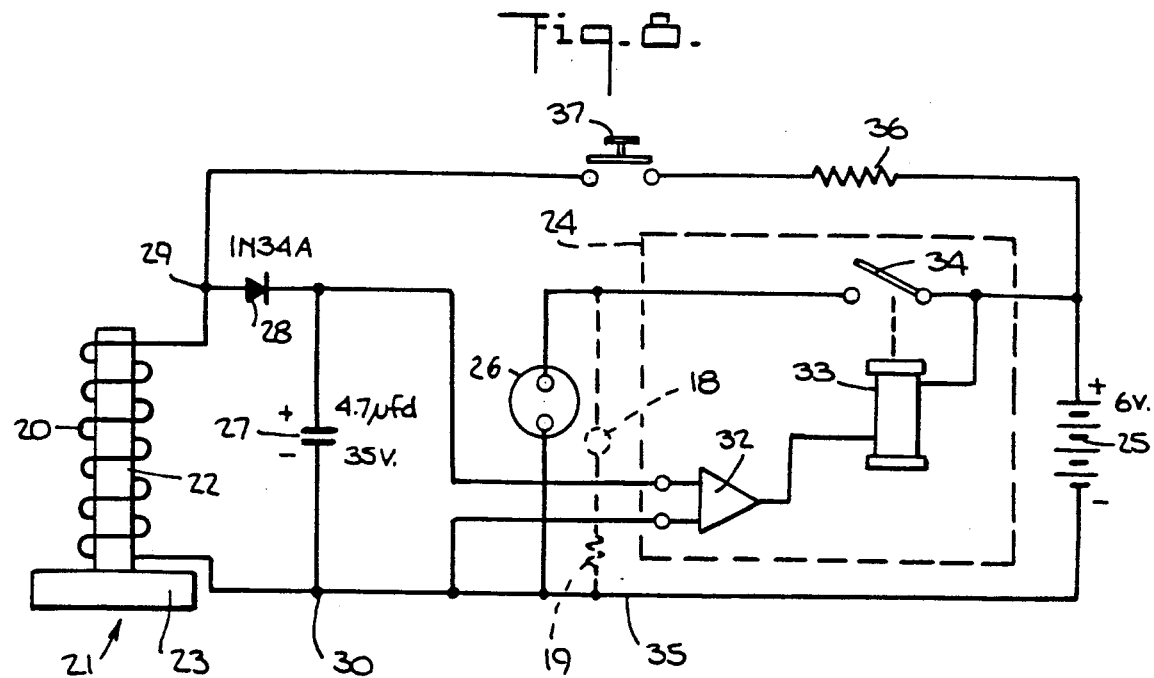
FIG. 8 is a schematic circuit diagram of the electrical components of the detector shown in FIGS. 3-7.

Now, referring to FIG. 8, there is shown in schematic form a circuit implementing the present invention. A multi-turn coil 20 is mounted or wound on a tee shape magnetic core 21 having a first portion 22 that extends through the coil 20 substantially co-axially, and having a second portion 23 disposed external to the coil 20 in magnetic circuit with the first portion 22. In a presently preferred embodiment the coil 20 and core portion 22 are constituted by a conventional relay coil having 45,700 turns of No. 39 A.W.G. wire wound on a 3 inch long core of circular cross-section with the external dimension of the winding measuring 2.875" in length and 1" in O.D. Thus, the core portion 22 projects slightly from each end of the coil 20. The winding has a resistance of 6500 ohms. The core portion 23 is in the form of a short bar of magnetic steel material, 15/16" long with a 5/16"×5/16" cross-section.

Voltage detecting means consisting of a voltage sensitive relay circuit 24, a battery 25, and a signalling device 26, is coupled across a capacitor 27 and through a germanium diode 28 to the end terminals 29 and 30 of the multi-turn coil 20. As best seen in FIGS. 3 to 6, a housing 31 is provided for the components 20, 21, 24, 25, 26, 27 and 28.

The relay circuit 24 is shown symbolically in FIG. 8 as consisting of an input voltage sensitive amplifier 32 controlling a relay 33 which, in turn, controls the switch 34 for completing a circuit from the positive terminal of battery 25 to one terminal of the signalling device 26, the opposite terminal of the device 26 being connected to the common bus 35 which connects to the negative battery terminal. A suitable relay is Model 16A1, obtained from Control Corporation, requiring a 6 volt D.C., 20 ma power source, and having a sensitivity of 1 volt D.C. at 50 microamperes. However, it will be understood that any equivalent relay device can be substituted. For the purpose of testing the operativeness of the detector there is provided a test circuit consisting of a resistor 36 connected in series with a momentary close push-button switch 37 between the positive terminal of battery 25 and the terminal junction 29 between coil 20 and diode 28. Resistor 36 should have a resistance between about 30K ohms and 35K ohms in order to furnish a relay triggering voltage to the input of amplifier 32 in excess of 1 volt.

In the embodiment of FIG. 8, the signalling device 26 has an audible output and consists of a piezo buzzer resonant at about 2800 hertz. However, it should be understood that device 26 can be a signal lamp, or any other controllable emitter of light or sound energy, or any combination of both. As an option, an LED 18 is shown connected in series with a resistor 19 in parallel with buzzer 26. A suitable LED 18 is Radio-Shack part 276041A. Resistor 19 is selected with a value of about 1500 ohms to limit current through LED 18.

The germanium diode 28 can be a type 1N34A while capacitor 27 is preferably an electrolytic type with a capacitance of about 4.7 mfd. and a voltage rating of 35 volts. The sounder 26 can be a piezo buzzer rated at 2800 Hz, 3-20 V.D.C., and 7 MA at 12 V.

The packaging of the components in the housing 31 is shown in FIGS. 3 to 6. Battery 25 is constituted by four size AA batteries, preferably of alkaline construction, mounted in a conventional battery holder 40 connected to the circuit by a convenient connector such as a polarized snap fastener assembly 41 of the type normally used for connection to 9 V. dry cell batteries.

Coil 20 is secured, for example by an adhesive (not shown), in position against side wall 42 of housing 31 spaced from housing end wall 43 by the core portion 23 whose longitudinal axis is positioned normal to the longitudinal axis of the first core portion 22 and parallel to housing walls 42, 43, 47 and 50.

Figure 3:
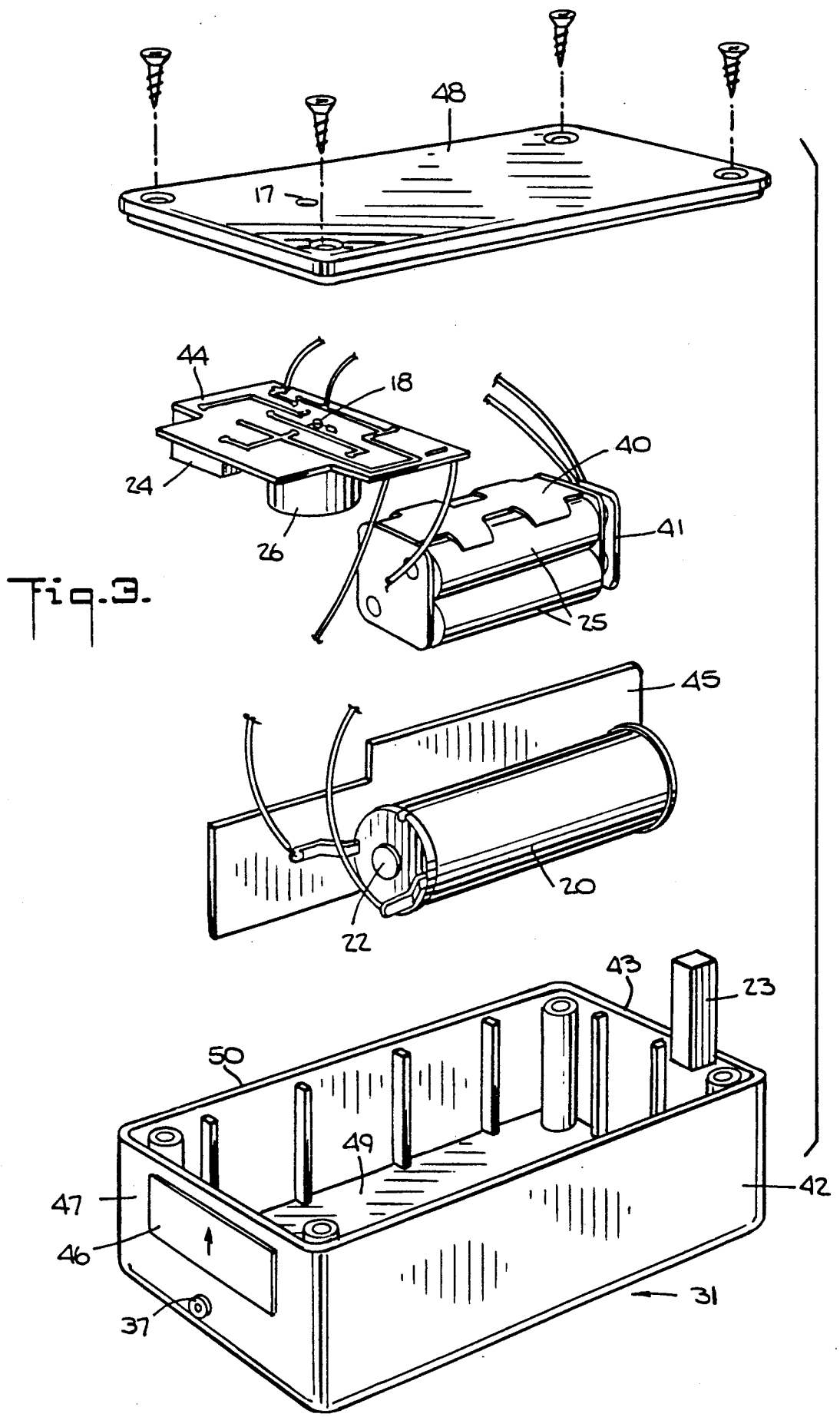
FIG. 3 is an exploded view of the open-coil detector, shown in FIG. 2, embodying the present invention.
Figure 4:
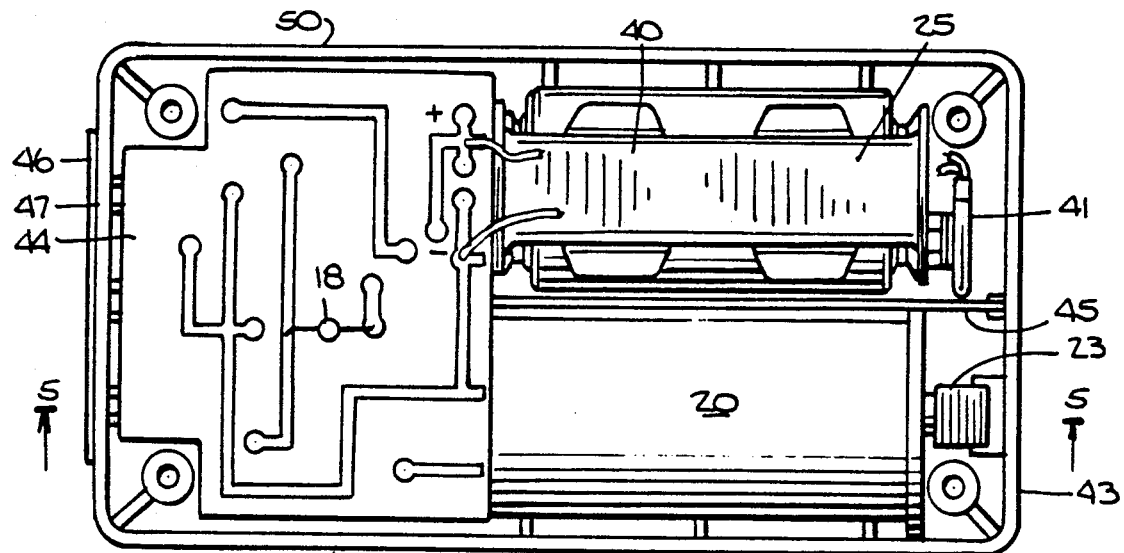
FIG. 4 is a plan view of the assembled open-coil detector of FIG. 3, but with the cover removed to show the internal components.
Figure 6:
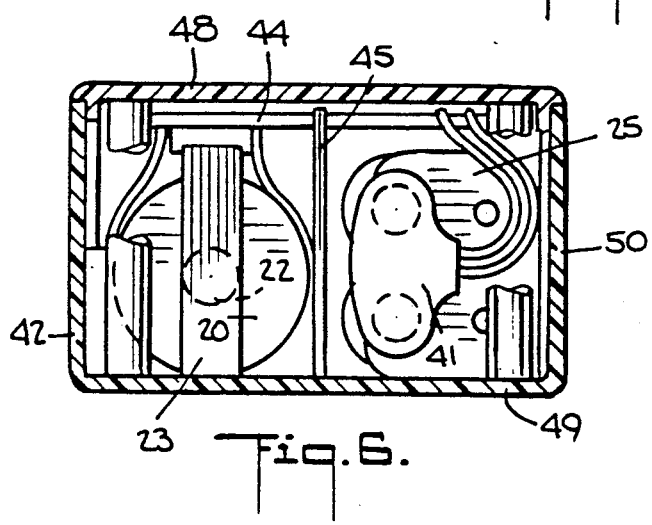
FIG. 6 is a transverse sectional view taken along the line 6—6 in FIG. 5.
Figure 7:
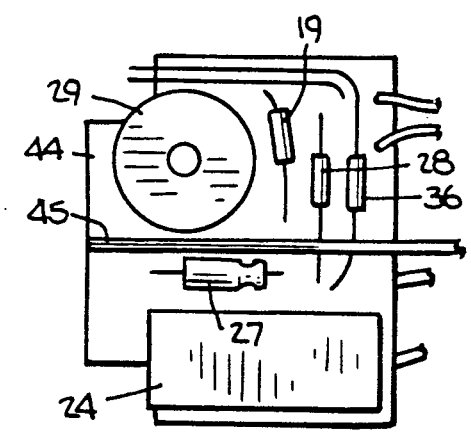
FIG. 7 is a fragmentary sectional view taken along line 7—7 in FIG. 5, showing the components mounted on a printed circuit board.
Figure 5:
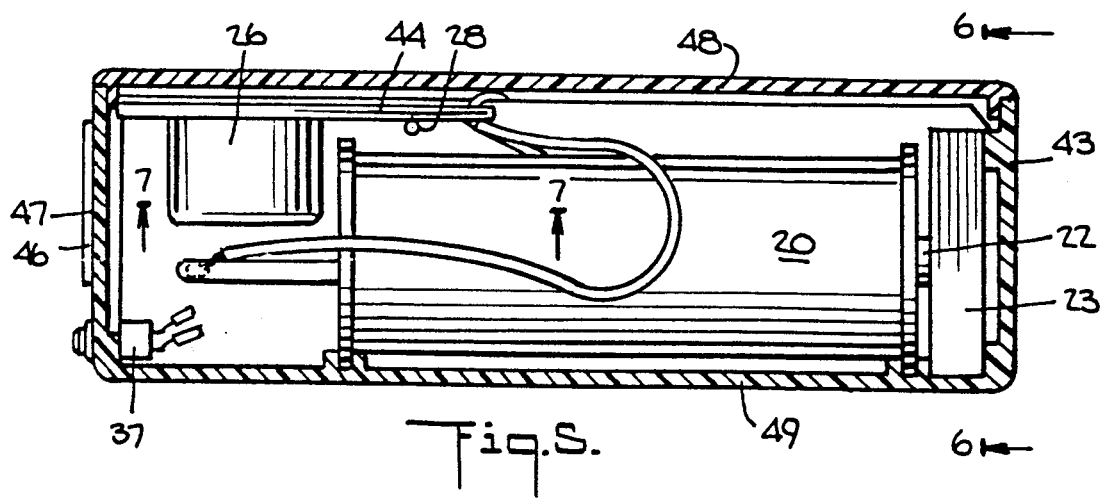
FIG. 5 is a longitudinal sectional view taken along the line 5—5 in FIG. 4, but with the cover in place.

The sounder signalling device 26, with relay 24, capacitor 27 and diode 28 as well as resistor 36 are mounted on a printed circuit board 44, as best seen in FIG. 7, while battery holder 40 is separated from winding 20 by an insulating spacer 45, e.g., 1/16" thick micarta. The push-button switch 37 can be located at any convenient position on the housing 31 so long as the switch is protected against inadvertent operation. A presently preferred location is shown in FIGS. 3 and 5. When present, the LED 18 is mounted on one side of circuit board 44 as shown in FIGS. 3 and 4, and resistor 19 is mounted on the opposite side of board 44 as shown in FIG. 7. To accommodate the LED 18, the housing cover 48 has an aperture 17 through which the LED is visible. Merely by way of illustration it is observed that housing 31 in a working model embodying the invention is 4.75" long, 1.4" high and 2.56" wide.

As will appear from the description to follow explaining use of the detector, it is important to know the location of core portion 23 in the housing 31 and its relative orientation. To this end, external indicia is provided on housing 31. In the example the indicia is applied via a label 46 affixed to the end wall 47 of housing 31 opposite the wall 43 to which core portion 23 is proximate. For purpose of illustration, the indicia is represented by an arrow but can be any assymetric marking. It will be seen from FIGS. 2 to 6, that the housing 31 is in the form of a hexahedron with rectangular top, bottom, first and second side walls and first and second end walls, respectively, 48, 49, 42, 50, 43 and 47, and the bar 23 of magnetic material is positioned adjacent end wall 43, with its longitudinal axis parallel to the walls 42, 43, 47 and 50.

Figure 2:
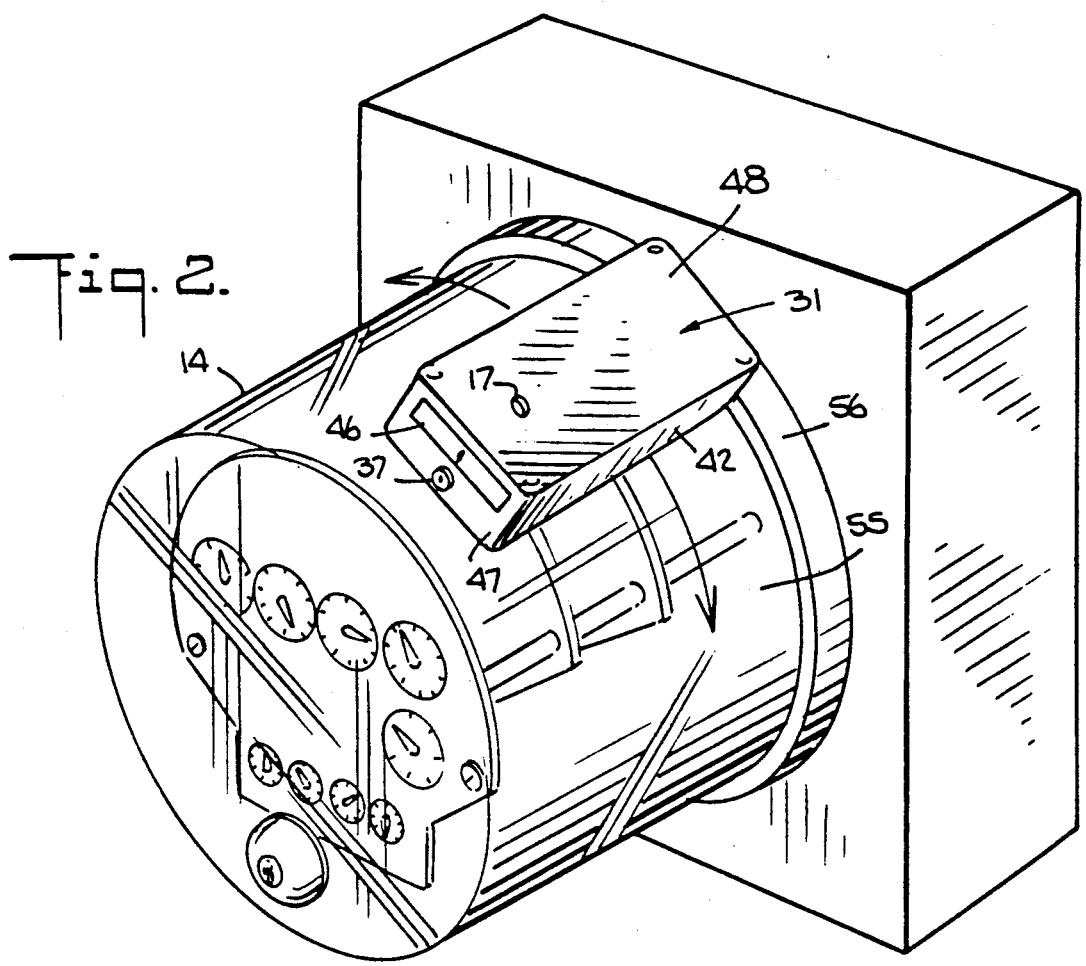
FIG. 2 is a perspective view of the meter of FIG. 1, drawn to an enlarged scale and showing the open-coil detector of the invention in operative relation thereto.
Figures 9, 10, 11:
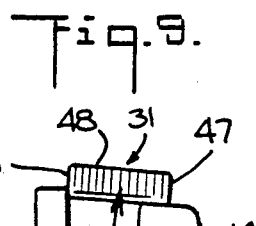
FIG. 9 is a diagrammatic illustration of a first mode of operation of the detector of FIGS. 3-8.
FIG. 10 is an illustration similar to FIG. 9, but showing a second mode of operation of the detector of FIGS. 3-8.
FIG. 11 is an illustration similar to FIG. 9, but showing a third mode of operation of the detector.

FIGS. 2 and 9 to 11 illustrate the method of using the detecting device. As shown in FIGS. 2 and 9, the meter reader or other field person first places the detecting device on the cylindrical glass housing 55 which housing is common to meters of the type in question. For the purpose of this discussion it will be assumed that the device has a sounder 26 as a signalling device. The housing 31 is placed as shown in FIGS. 2 and 9 with bottom 49 against housing 55 and with end wall 43 against the flange 56 of the meter enclosure. Then, as illustrated in FIGS. 2 and 9, the housing 31 is swept around housing 55 through an arc of about 180° covering the upper half of the meter. If an audible signal results, it can be assumed that the voltage coil is effectively operative. However, if no signal is obtained the housing 31 should be rotated to the position shown in FIG. 10, with side wall 42 against flange 56, and another circumferential sweep executed about an arc of about 180°. Failing to get a signal from this orientation, resort should be had to the positioning shown in FIG. 11 where end wall 43 is applied against flange 56 and housing 31 is inclined and swept circumferentially. Finally, if no signal is developed for all three scanning positions, it can be assumed with exceptional reliability that a voltage coil is disconnected or otherwise inoperative. In this situation the meter reader or other personnel can take steps to open and examine the meter more directly. Of course, it has been assumed that the eddy current disc in the meter is in motion as an indication that power is being utilized.

Actually, with a fully operative polyphase meter a signal from the instrument should be produced for two different locations relative to the meter housing 55. Certain meters have both voltage coils located toward the back by the flange 56. In that case signals will usually be generated at approximately the 10 o'clock and 2 o'clock positions about housing 55. However, a few meters have the voltage coils aligned parallel to the axis of housing 55 with one coil toward the back and the other toward the front of the meter. Having located a coil toward the back, say for example at 2 o'clock, the instrument can then be moved along a path perpendicular to flange 56 toward the front of housing 55 where a second voltage coil should be found.

Because the current drain of the circuit of FIG. 8 is minimal, it is not necessary to have an on/off power switch. When alkaline batteries are used for battery 25, the useable life should be in excess of one year.

While the instrument has been described as packaged in a single enclosure it should be apparent that the pickup coil can be incorporated in a probe and the remaining circuitry packaged in a small enclosure.

Having described the invention with reference to the presently preferred embodiment thereof, it should be understood that various changes in construction can be adopted without departing from the true spirit of the invention as defined in the appended claims.

What is claimed is:

1. A portable hand holdable open-coil detector for detecting the absence of a detectable magnetic field proximate to a voltage coil of an electric power meter, comprising in combination a multi-turn coil mounted on a magnetic core; voltage detecting means coupled to said multi-turn coil and including bi-conditional signalling means; housing means for said multi-turn coil, magnetic core, and voltage detecting means; said housing means having walls and locating said magnetic core in a predetermined disposition relative to said walls such that when said housing is placed in a predetermined orientation in contact with the enclosure encompassing a normally operating electric power meter in a position overlying a meter voltage coil carrying current, sufficient voltage will be induced in said multi-turn coil to alter the condition of said signalling means from a first condition indicative of a non-active voltage coil to a second condition indicative of an active voltage coil, and external indicia associated with said housing for use in placing said housing in said predetermined orientation.

2. A portable hand holdable open-coil detector according to claim 1, wherein said magnetic core comprises a first portion extending through said multi-turn coil substantially co-axially, and a second portion disposed external to said multi-turn coil in magnetic circuit with said first portion and positioned to increase said induced voltage for a given current flowing through said meter voltage coil.

3. A portable hand holdable open-coil detector according to claim 2, wherein said first portion of said magnetic core has a circular cross-section and extends through said multi-turn coil to project from at least one end of said multi-turn coil at a first core end, and said second portion of said magnetic core comprises a short bar of magnetic material disposed in contact with said first core end of said first portion with the longitudinal axis of said short bar normal to the longitudinal axis of said first portion.

4. A portable hand holdable open-coil detector according to claim 3, wherein said magnetic core is substantially tee shape.

5. A portable hand holdable open-coil detector according to claim 4, wherein said external indicia is adapted to indicate the location within said housing of said second portion of said magnetic core.

6. A portable hand holdable open-coil detector according to claim 5, wherein said second portion of said magnetic core is disposed adjacent a wall of said housing means.

7. A portable hand holdable open-coil detector according to claim 6, wherein said housing means is in the form of a hexahedron with rectangular top, bottom, side and end walls, and said bar of magnetic material is positioned adjacent one of said walls parallel thereto.

8. A portable hand holdable open-coil detector according to claim 1, wherein said magnetic core is substantially tee shape.

9. A portable hand holdable open-coil detector according to claim 3, wherein said housing means is in the form of a hexahedron with rectangular top, bottom, side and end walls, and said bar of magnetic material is positioned adjacent one of said walls parallel thereto.

10. A portable hand holdable open-coil detector according to claim 2, wherein said external indicia is adapted to indicate the location within said housing of said second portion of said magnetic core.

11. A portable hand holdable open-coil detector according to claim 10, wherein said second portion of said magnetic core is disposed adjacent a wall of said housing means.

12. A portable hand holdable open-coil detector according to claim 3, wherein said housing means is in the form of a hexahedron with rectangular top, bottom, side and end walls, and said bar of magnetic material is positioned adjacent one of said end walls parallel thereto.

13. A portable hand holdable open-coil detector according to claim 2, wherein said magnetic core is substantially tee shape.

14. A portable hand holdable open-coil detector according to claim 13, wherein said external indicia is adapted indicate the location within said housing of said second portion of said magnetic core.

15. A portable hand holdable open-coil detector according to claim 14, wherein said second portion of said magnetic core is disposed adjacent a wall of said housing means.

16. A portable hand holdable open-coil detector according to claim 1, wherein said voltage detecting means comprises a germanium diode and a capacitor connected in series across opposite ends of said multiturn coil in parallel therewith, a voltage sensitive relay having an input connected across said capacitor and having an output connected to said signalling means.

17. A portable hand holdable open-coil detector according to claim 16, wherein said magnetic core is substantially tee shape.

18. A portable hand holdable open-coil detector according to claim 17, wherein said housing means is in the form of a hexahedron with rectangular top, bottom, side and end walls, and the cross bar of said magnetic core is positioned adjacent one of said walls parallel thereto.

* * * * *

UNITED STATES PATENT AND TRADEMARK OFFICE
CERTIFICATE OF CORRECTION

PATENT NO. : 5,017,877

DATED : May 21, 1991

INVENTOR(S) : Paul Z. Haus, Jr.

It is certified that error appears in the above-identified patent and that said Letters Patent is hereby corrected as shown below:

Col. 4, line 3, after "material," change "15/16"" to --1 5/16"--.

Col. 8, line 6, after "adapted" insert --to--.

Signed and Sealed this

Twenty-second Day of September, 1992

*Attest:*

DOUGLAS B. COMER

*Attesting Officer*     *Acting Commissioner of Patents and Trademarks*